United States Patent
Freyman et al.

(10) Patent No.: US 7,298,195 B2
(45) Date of Patent: Nov. 20, 2007

(54) METHODS AND APPARATUS FOR IMPROVED PHASE SWITCHING AND LINEARITY IN AN ANALOG PHASE INTERPOLATOR

(75) Inventors: Ronald L. Freyman, Bethlehem, PA (US); Craig B. Ziemer, Fleetwood, PA (US)

(73) Assignee: Agere Systems Inc., Allentown, PA (US)

( * ) Notice: Subject to any disclaimer, the term of this patent is extended or adjusted under 35 U.S.C. 154(b) by 15 days.

(21) Appl. No.: 11/095,771

(22) Filed: Mar. 31, 2005

(65) Prior Publication Data

US 2006/0220719 A1   Oct. 5, 2006

(51) Int. Cl.
*H03K 5/13* (2006.01)
(52) U.S. Cl. ............ 327/247; 327/234; 327/235; 327/359; 327/560
(58) Field of Classification Search .......... None
See application file for complete search history.

(56) References Cited

U.S. PATENT DOCUMENTS

| | | | | |
|---|---|---|---|---|
| 5,122,687 A | * | 6/1992 | Schmidt | 326/52 |
| 5,151,624 A | * | 9/1992 | Stegherr et al. | 327/356 |
| 5,371,475 A | * | 12/1994 | Brown | 330/254 |
| 5,625,318 A | * | 4/1997 | Sevenhans et al. | 327/563 |
| 6,597,212 B1 | * | 7/2003 | Wang et al. | 327/117 |

OTHER PUBLICATIONS

Weinlander et al., "An 8 channel 36G Sample/s CMOS Timing Analyzer," IEEE ISSCC (2000).
Sidiropoulos et al., "A Semi-digital Dual Delay-Locked Loop," IEEE JSSC, vol. 32, No. 11 (1997).

* cited by examiner

*Primary Examiner*—Kenneth B. Wells
*Assistant Examiner*—An T. Luu

(57) ABSTRACT

Methods and apparatus are provided for improving phase switching and linearity in an analog phase interpolator. A phase interpolator in accordance with the present invention comprises (i) a plurality of tail current sources that are activated for substantially all times when the phase interpolator is operational; (ii) at least two pairs of input transistor devices, wherein one pair of the input transistor devices is associated with a minimum phase of the phase interpolator and another pair of the input transistor devices is associated with a maximum phase of the phase interpolator; and (iii) a plurality of current steering switches that provide currents generated by the plurality of tail current sources to one or more of the at least two pairs of input transistor devices, based on an applied interpolation control signal.

17 Claims, 3 Drawing Sheets

METHODS AND APPARATUS FOR IMPROVED PHASE SWITCHING AND LINEARITY IN AN ANALOG PHASE INTERPOLATOR

FIELD OF THE INVENTION

The present invention is related to techniques for clock and data recovery (CDR) techniques and, more particularly, to techniques for improving the switching times and linearity of phase interpolators.

BACKGROUND OF THE INVENTION

In many applications, including digital communications, clock and data recovery (CDR) must be performed before data can be decoded. Generally, in a digital clock recovery system, a reference clock signal of a given frequency is generated together with a number of different clock signals having the same frequency but with different phases. In one typical implementation, the different clock signals are generated by applying the reference clock signal to a delay network. Thereafter, one or more of the clock signals are compared to the phase and frequency of an incoming data stream and one or more of the clock signals are selected for data recovery.

A number of existing digital CDR circuits use voltage controlled delay loops (VCDL) to generate a number of clocks having the same frequency and different phase for data sampling (i.e., oversampling). One technique for generating multiple clock signals having a phase spacing that is smaller than a delay element is to interpolate between the delay stage phases. Phase interpolators are typically controlled by an N bit interpolation control word that selects a desired one of $2^N$ possible phases. In one typical implementation, the phase interpolator comprises $2^N$ dedicated interpolators, each associated with a given desired phase, and the array of $2^N$ interpolator outputs are multiplexed to select the desired clock phase. Such an array of $2^N$ interpolators, however, consumes considerable area and power, especially as the number of interpolated phases increases.

In another common implementation, a single interpolator is comprised of N weighted current sources that are selectively turned on or off, in accordance with the applied N bit interpolation control word, to obtain the desired clock phase. When a given current source is turned off, however, it takes time for the transistor drain to turn back on and reach steady state. With 90 nM transistor technology, for example, it has been found that the time it takes to switch from one phase to another desired phase is too slow (on the order of greater than 500 ps).

A need therefore exists for improved techniques for interpolating two input clock signals to generate a clock signal having a phase between the phase of the two input clock signals. A further need exists for improved interpolation techniques that provide fast-switching variable clock phases, and a highly linear phase interpolation transfer function, while utilizing less power and area.

SUMMARY OF THE INVENTION

Generally, methods and apparatus are provided for improving phase switching and linearity in an analog phase interpolator. A phase interpolator in accordance with the present invention comprises (i) a plurality of tail current sources that are activated for substantially all times when the phase interpolator is operational; (ii) at least two pairs of input transistor devices, wherein one pair of the input transistor devices is associated with a minimum phase of the phase interpolator and another pair of the input transistor devices is associated with a maximum phase of the phase interpolator; and (iii) a plurality of current steering switches that provide currents generated by the plurality of tail current sources to one or more of the at least two pairs of input transistor devices, based on an applied interpolation control signal.

The plurality of tail current sources drive each of the at least two pairs of input transistor devices. In addition, according to another aspect of the invention, the plurality of tail current sources provide substantially identical currents to each of the at least two pairs of input transistor devices. The switching times of transistors in the current steering switches are optionally controlled using an array of switch buffers. In addition, the plurality of tail current sources are optionally weighted to provide a number of desired phase increments A more complete understanding of the present invention, as well as further features and advantages of the present invention, will be obtained by reference to the following detailed description and drawings.

DETAILED DESCRIPTION

The present invention provides methods and apparatus for generating multiple clock phases, with a highly linear interpolation transfer function, and fast-switching between phases, for data sampling in clock and data recovery (CDR) systems. According to one aspect of the invention, weighted input devices provide linear interpolation over a wide range of operating frequencies.

Figure 1:
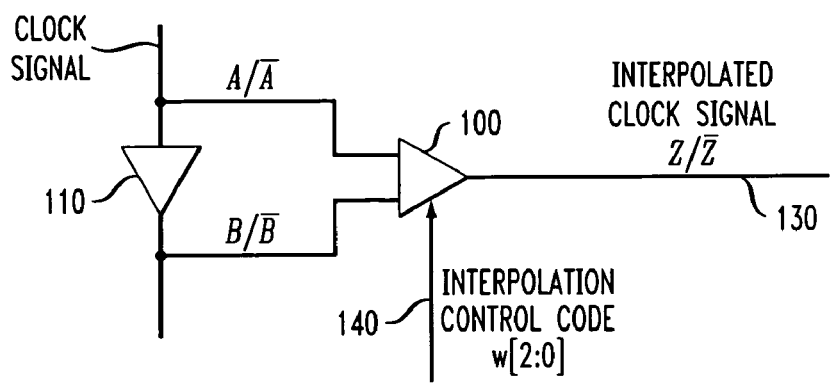
FIG. 1 is a schematic block diagram of a conventional phase interpolator.

FIG. 1 is a schematic block diagram of a conventional phase interpolator 100. As shown in FIG. 1, an input clock signal is applied to a delay stage 110 to generate two phase offset clock signals that are applied to the input of the analog phase interpolator 100. The input clock signal may be generated, for example, by a local voltage controlled oscillator (VCO) or a voltage controlled delay loop (VCDL). The analog phase interpolator 100 generates an interpolated clock signal 130 having a desired phase in response to an interpolation control code 140, in a known manner. For example, an interpolation control code 140 of 000 may correspond to a minimum phase value and an interpolation control code 140 of 111 may correspond to a maximum phase value.

Generally, the analog phase interpolator 100 generates an output clock having a phase that is the weighted sum of the two input phases. As shown in FIG. 1, the interpolator 100 receives two differential inputs, A/Ā and B/B̄, and generates an output phase, Z/Z, that is the weighted sum of the input phases. The weighting ratio is determined by the exemplary 3-bit phase control code 140.

Figure 2:
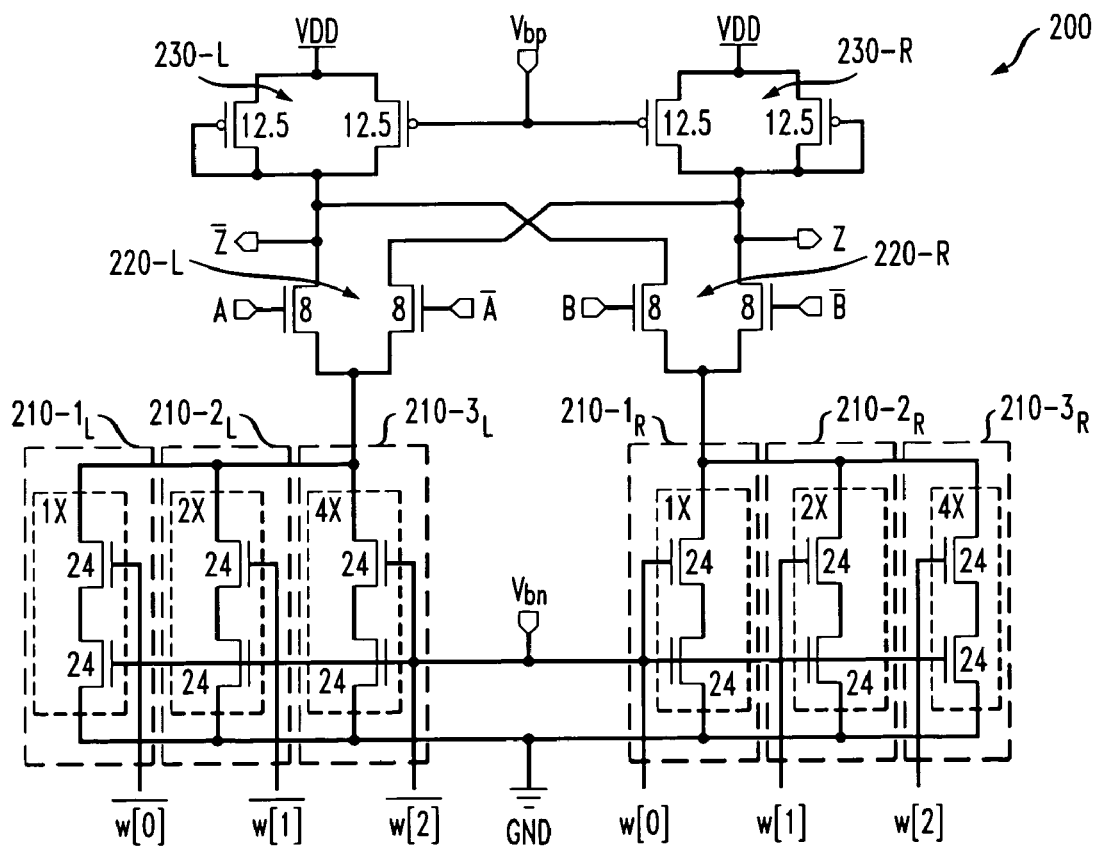
FIG. 2 is a circuit diagram of an implementation of a conventional interpolator of FIG. 1.

FIG. 2 is a circuit diagram 200 of an implementation of a conventional interpolator of FIG. 1. The exemplary conventional interpolator 200 is an adjustable interpolator with a 3 bit adjustment range (w[2:0]). The interpolator 200 receives two differential inputs, A/Ā and B/B̄, and generates an output phase, Z/Z̄, that is the weighted sum of the input phases. The weighting ratio is determined by the 3-bit phase control input, w[2:0].

As shown in FIG. 2, weighted current sources 210-1 through 210-3 on each side (left, L, and right, R) of the interpolator 200 are switched on and off, based on the 3-bit phase control code 140, to achieve the desired output phase. Each weighted current source 210 is comprised of two transistors. The top transistor in each set turns the current source on or off, based on the corresponding binary weight value, w. The bottom transistor in each set is controlled by a voltage bias, $V_{bn}$, that serves to weight the current source appropriately. It is noted that the number adjacent each transistor, such as 24, indicates the transistor width for an exemplary FET implementation, and the Nx number, such as 4x, indicates the number of such FET transistors that are wired in parallel for binary weighting.

For example, when the 3-bit phase control code 140 has a value of 000, the weighted current sources 210-1$_L$ through 210-3$_L$ on the left side of the interpolator 200 are active and the current is applied to the input transistors 220-L on the left side of the interpolator 200 (and the output phase, Z/Z̄, will follow the phase of the input, A/Ā). Similarly, when the 3-bit phase control code 140 has a value of 111, the weighted current sources 210-1$_R$ through 210-3$_R$ on the right side of the interpolator 200 are active and the current is applied to the input transistors 220-R on the right side of the interpolator 200 (and the output phase, Z/Z̄, will follow the phase of the input, B/B̄). For intermediate values of the 3-bit phase control code 140, the current sources 210 are activated accordingly and an intermediate phase output is obtained at the output of the interpolator 200.

Generally, the interpolator 200 is implemented as two current mode logic (CML) buffers having cross-coupled outputs. Each CML buffer is comprised of tail current sources 210, input devices 220 and load transistors 230.

The exemplary 3-bit interpolator 200 of FIG. 2 provides 8 ($2^3$) distinct phase levels (0Φ through 7Φ). The architecture of FIG. 2 can be extended to provide $2^N$ distinct phase levels for an N bit interpolation control signal, by adding an additional weighted current source 210 for each additional bit, for a total of N weighted current sources 210. Thus, the power and area requirements of the interpolator 200 of FIG. 2 increase linearly with the value of N.

In an alternate implementation, $2^N$ dedicated interpolators can be employed, each associated with one of $2^N$ corresponding phase values. The current source associated with each of the $2^N$ interpolators can remain active at all times when the overall interpolator is operational, and the current source corresponding to a desired phase can be selected. Thus, such an alternate implementation would not require switching current sources on and off to achieve a desired phase.

The implementation of FIG. 2 selectively turns the current sources 210 on and off, based on the N bit interpolation control word 140, to achieve a desired one of $2^N$ phases. As previously indicated, when a given current source 210 is turned off, however, it takes time for the transistor drain to turn back on and reach steady state. With 90 nM transistor technology, for example, it has been found that the time it takes to switch from one phase to another phase exceeds 500 ps. Thus, a faster approach is needed for switching from one phase to another.

Figure 3:
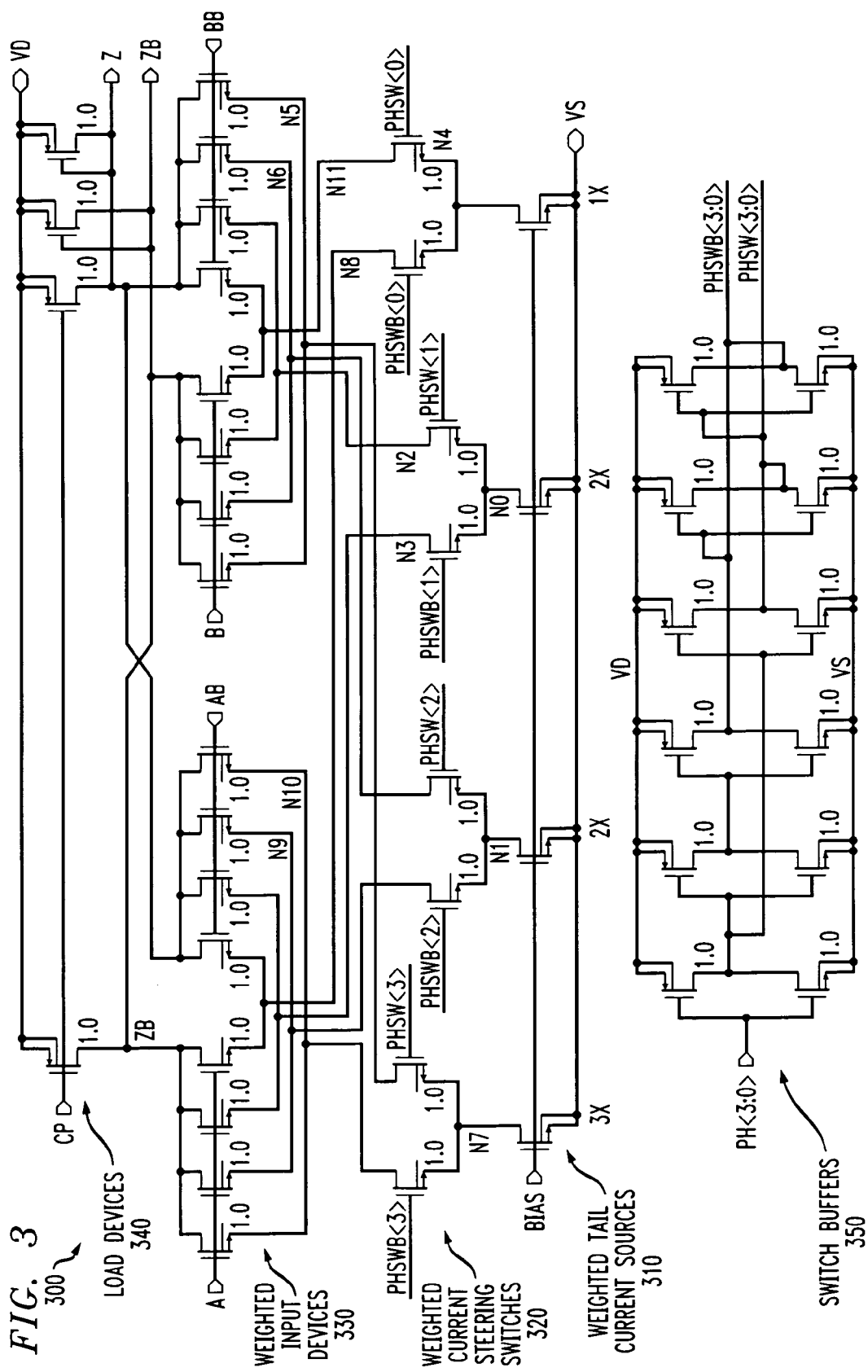
FIG. 3 is a circuit diagram of a phase interpolator circuit incorporating features of the present invention.

The present invention recognizes that as data rate, power, and area requirements become more stringent, it becomes even more important for the interpolator 100 to provide fast-switching variable clock phases, and a highly linear phase interpolation transfer function, while utilizing less power and area. FIG. 3 is a circuit diagram of a phase interpolator circuit 300 incorporating features of the present invention.

Generally, the exemplary phase interpolator circuit 300 of FIG. 3 employs four weighted tail current sources 310-1 through 310-4, via pairs of current steering switches 320-1 through 320-4, similar to a high-speed digital-to-analog converter, to provide identical currents to both sides of the interpolator 300, minimizing mismatch errors. The tail current sources 310 are always on, and the current is simply steered from one side to the other by the current steering switches 320, providing fast phase switching. The phase-to-phase switching characteristic for the phase interpolator circuit 300 is discussed below in conjunction with FIG. 4. Each current steering switch 320 selectively passes current to a left or right-side input device 330-L, 330-R, based on the applied interpolation control word.

As shown in FIG. 3, the exemplary four tail current sources 310 are optionally weighted according to a ratio of 3-2-2-1, which provides 8 equal phase increments. Binary weighting could also be used to provide 15 phase increments. It is noted that the same set of four tail current sources 310 drives both sides of the phase interpolator circuit 300. Thus, there is no potential current source mismatch that will impair the linearity of the phase interpolator circuit 300.

According to another aspect of the invention, the weighted input devices 330-L and 330-R on the left and right side of the phase interpolator circuit 300, respectively, are each comprised of a plurality of weighted transistors. The weighting ratio in the exemplary embodiment is 3-2-2-1 as in the tail current sources, and the weighted input transistor is connected to a tail current source of similar weight. In this manner, the transistors do not see a large range of current from the current sources 320 and the gain of the input devices 330 can be scaled to improve linearity. Thus, the weighted input devices 330 provide constant gain for both sides of the interpolator 300 regardless of the weighting ratio chosen, resulting in high linearity of the phase interpolation transfer function.

According to yet another aspect of the invention, an array of switch buffers 350 is provided to ensure that the transistors in the current steering switches 320 turn on and off at the same time. As shown in FIG. 3, the exemplary array of switch buffers 350 is similar to a high speed digital-to-analog converter. The array of switch buffers 350 receives the interpolation control word and configures the transistors in the current steering switches 320 to steer the current to the left or right side input devices 330, as appropriate.

The exemplary phase interpolator circuit 300 is an adjustable interpolator with a 4 bit adjustment range (PH[3:0]). The phase interpolator circuit 300 receives two differential inputs, A/Ā and B/B̄, and generates an output phase, Z/Z̄, that is the weighted sum of the input phases. The weighting ratio is determined by the 4-bit phase control input, PH[3:0]. For example, when the 4-bit phase control code has a value of 0000, the minimum phase is desired, and all the current from the weighted current sources 310 is steered by the current steering switches 320 to the left-side weighted input device 330-L (and the output phase, Z/Z̄, will follow the phase of the input, A/Ā). Similarly, when the 4-bit phase control code 140 has a value of 1111, the minimum phase is desired, and all the current from the weighted current sources 310 is steered by the current steering switches 320 to the right-side weighted input device 330-R (and the output phase, Z/$\overline{Z}$, will follow the phase of the input, B/$\overline{B}$). For intermediate values of the 4-bit phase control code, the current from the weighted current sources 310 is steered by the current steering switches 320 to both the left and right side input devices 330-L, 330-R, in accordance with the weighting, and an intermediate phase output is obtained at the output of the interpolator 300.

Figure 4:
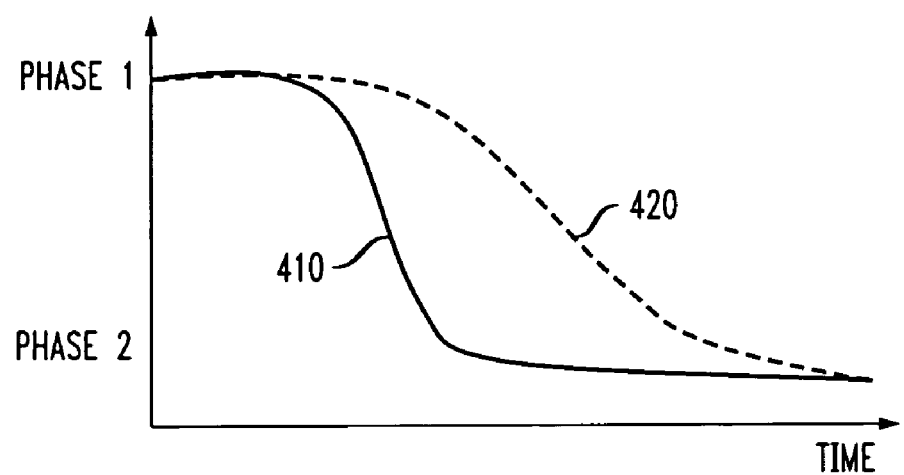
FIG. 4 is a set of characteristic curves illustrating phase-to-phase switching speed.

FIG. 4 is a set of characteristic curves illustrating phase-to-phase switching speed. As shown in FIG. 4, the phase interpolator circuit 300 of the present invention provides a phase-to-phase switching speed characteristic 410 that is much faster than the phase-to-phase switching speed characteristic 420 of the conventional design of FIG. 2.

Figure 5:
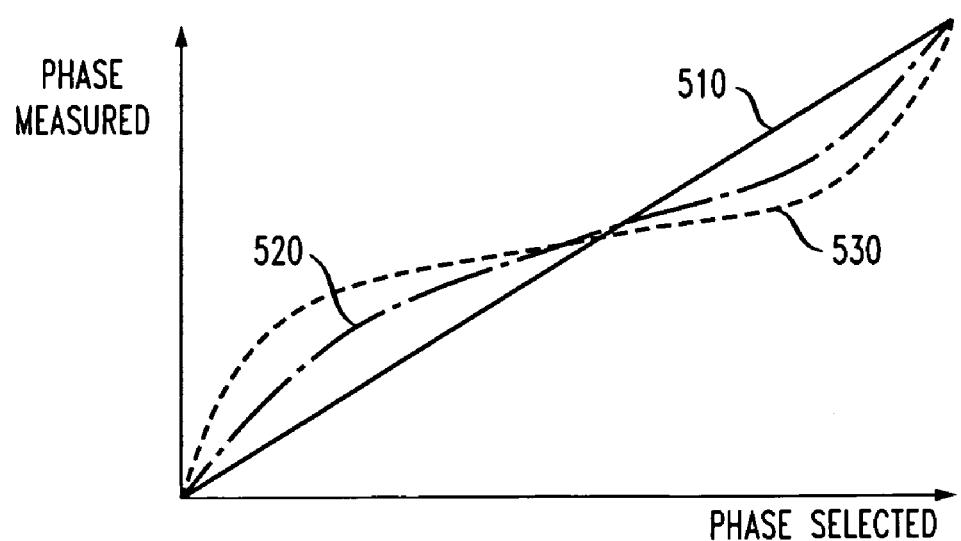
FIG. 5 is a set of characteristic curves illustrating the phase of the interpolated clock signal as a function of the applied interpolation control code.

FIG. 5 is a set of characteristic curves 510, 520, 530 illustrating the phase of the interpolated clock signal as a function of the applied interpolation control code for an ideal interpolator, the interpolator 300 of FIG. 3, and the interpolator 200 of FIG. 2, respectively.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A phase interpolator, comprising:
a plurality of tail current sources that are activated for substantially all times when said phase interpolator is operational;
at least two pairs of differential input transistor devices, wherein each pair of differential input transistor devices comprises two inputs, wherein one pair of said differential input transistor devices is associated with a minimum phase of said phase interpolator and another pair of said differential input transistor devices is associated with a maximum phase of said phase interpolator; and
a plurality of current steering switches that provide currents generated by said plurality of tail current sources to one or more of said at least two pairs of differential input transistor devices, based on an applied interpolation control signal, wherein said phase interpolator further comprises an array of switch buffers to control switching times of transistors in said current steering switches.

2. The phase interpolator of claim 1, wherein said plurality of tail current sources drive each of said at least two pairs of differential input transistor devices.

3. The phase interpolator of claim 1, wherein said plurality of tail current sources provide substantially identical currents to each of said at least two pairs of differential input transistor devices.

4. The phase interpolator of claim 1, wherein each of said pairs of differential input transistor devices comprises a plurality of transistors.

5. The phase interpolator of claim 1, wherein said phase interpolator generates a signal having a desired phase between a phase of two applied input signals.

6. The phase interpolator of claim 1, wherein said plurality of tail current sources are weighted to provide a number of desired phase increments.

7. A method for generating a signal having a desired phase between a phase of two applied input signals, composing:
generating a current signal using a plurality of tail current sources that are activated for substantially all times when said phase interpolator is operational; and
steering said current signal to one or more of at least two pairs of differential input transistor devices based on an applied interpolation control signal, wherein each pair of differential input transistor devices comprises two inputs, wherein one pair of said differential input transistor devices is associated with a minimum phase and another pair of said differential input transistor devices is associated with a maximum phase, said method further comprising the step of controlling switching times of transistors that perform said steering step.

8. The method of claim 7, wherein said current signal drives said at least two pairs of differential input transistor devices.

9. The method of claim 7, wherein said current signal provide substantially identical currents to said at least two pairs of differential input transistor devices.

10. The method of claim 7, wherein each of said pairs of differential input transistor devices comprises a plurality of transistors.

11. method of claim 7, further comprising the step of weighting said plurality of tail current sources to provide a number of desired phase increments.

12. An integrated circuit, comprising:
a phase interpolator, comprising:
a plurality of tail current sources that are activated for substantially all times when said phase interpolator is operational;
at least two pairs of differential input transistor devices, wherein each pair of differential input transistor devices comprises two inputs, wherein one pair of said differential input transistor devices is associated with a minimum phase of said phase interpolator and another pair of said differential input transistor devices is associated with a maximum phase of said phase interpolator; and
a plurality of current steering switches that provide currents generated by said plurality of tail current sources to one or more of said at least two pairs of differential input transistor devices, based on an applied interpolation control signal, wherein said phase interpolator further comprises an array of switch buffers to control switching times of transistors in said current steering switches.

13. The integrated circuit of claim 12, wherein said plurality of tail current sources drive each of said at least two pairs of differential input transistor devices.

14. The integrated circuit of claim 12, wherein said plurality of tail current sources provide substantially identical currents to each of said at least two pairs of differential input transistor devices.

15. The integrated circuit of claim 12, wherein each of said pairs of differential input transistor devices comprises a plurality of transistors.

16. The integrated circuit of claim 12, wherein said phase interpolator generates a signal having a desired phase between a phase of two applied input signals.

17. The integrated circuit of claim 12, wherein said plurality of tail current sources are weighted to provide a number of desired phase increments.

* * * * *